United States Patent [19]

Paur

[11] Patent Number: 4,918,380
[45] Date of Patent: Apr. 17, 1990

[54] SYSTEM FOR MEASURING MISREGISTRATION

[76] Inventor: Tom R. Paur, 22608 NE. 12th Pl., Redmond, Wash. 98053

[21] Appl. No.: 253,017

[22] Filed: Oct. 3, 1988

Related U.S. Application Data

[63] Continuation-in-part of Ser. No. 216,080, Jul. 7, 1988.

[51] Int. Cl.$^4$ .................... G01R 31/02; G01R 31/04; H05K 1/09
[52] U.S. Cl. ................................. 324/73.1; 174/262; 324/158 R; 324/538
[58] Field of Search ............... 324/73 PC, 158 R, 537, 324/538; 361/403, 414; 174/68.5

[56] References Cited

U.S. PATENT DOCUMENTS

| | | | |
|---|---|---|---|
| 3,243,498 | 3/1966 | Allen et al. | 174/68.5 |
| 3,859,711 | 1/1975 | McKiddy | 324/73 PC |
| 4,432,037 | 2/1984 | Brabetz | 174/68.5 |
| 4,510,446 | 4/1985 | Braun et al. | 324/158 R |

OTHER PUBLICATIONS

MIL-STD-275E, 12/31/84 Superseding MIL-STD-275D, Apr. 26, 1978; and MIL-STD-1495, Aug. 3, 1973-Military Standard-Printed Wiring for Electronic Equipment, Department of Defense.

Primary Examiner—Ernest F. Karlsen
Attorney, Agent, or Firm—Seed & Berry

[57] ABSTRACT

A system for measuring the amount and direction of misregistration of each layer of a panel from which multilayer printed circuit boards are separated. The system utilizes a conductor pattern having a conductive trace positioned on each layer of the panel. Each conductive trace includes two trace portions positioned in opposing relation with a plurality of conductive through-holes being positioned therebetween. Each trace portion includes a plurality of elongate conductor portions positioned incrementally varying distances from a common axis. The conductive through-holes are formed in the panel after the layers have been fabricated and joined. If the through-holes are in electrical contact with either trace portion, then the amount of misregistration can be determined. Further, by determining which trace portion the through-hole is in contact with, the direction of misregistration can be determined. By adding additional trace portions, the quantity of misregistration in other directions may be determined.

11 Claims, 3 Drawing Sheets

SYSTEM FOR MEASURING MISREGISTRATION

RELATED APPLICATIONS

This is a continuation-in-part of pending U.S. Application Ser. No. 216,08 entitled SYSTEM FOR MEASURING MISREGISTRATION OF PRINTED CIRCUIT BOARD LAYERS filed July 7, 1988, by Tom R. Paur.

TECHNICAL FIELD

The present invention relates generally to printed circuit boards, and more particularly, to an improved system for measuring the amount of misregistration of printed circuit board layers.

BACKGROUND ART

In the fabrication of printed circuit boards using multiple layers, each of the layers is fabricated in face-to-face juxtaposition and has electrically conductive traces thereon which require interconnection between the layers. Such interconnection is usually accomplished by a drilled and then metallic-plated through-hole which extends through the layers and is located to cause the plated through-hole to contact the particular traces or pads thereof on one or more of the layers and create an electrically conductive path between the desired traces on different layers. For such a fabrication technique to be effective, it is very important that each of the inner layers of the printed circuit board be in precise registration or alignment with an exterior layer of the printed circuit board so that the relative positions of the traces on different layers are predictable and the through-holes, which are formed after assembly of the layers, will make contact with the desired traces and only those traces. If an inner layer registration with the exterior layer or with any of the other interior layers by too large of an amount, the through-hole will not contact the desired trace, or will contact an undesired trace, and a defective board will result.

As with most fabrication processes, perfect registration of inner layers with the exterior layer is not possible, and the size and placement of the traces must be designed to take into account the fact that some misregistration is inevitable. The larger the amount of misalignment anticipated, the larger the spaces between traces must be to ensure that the through-hole will contact only the desired traces. This reduces the number of electronic devices which may be placed on the printed circuit board, commonly referred to as the packaging density of the board, and hence increases the cost of the printed circuit boards required for a particular circuit.

In the past, after the printed circuit board was fabricated, it was possible to determine whether or not the layer-to-layer registration was correct or incorrect by simply determining whether or not the through-holes made electrical contact with all of the proper traces and no others. Usually, a particular through-hole was checked to make sure it was in contact with a particular trace, and if it was not, the board failed. On the other hand, if all of the through-holes, or however many that were checked, contacted all of the desired traces, the board passed. Rather than checking all through-holes, a sampling was often made. At other times, a test set of traces and through-holes (called a "test coupon") was created for the purpose of testing registration. In all situations, the test simply produced a "pass" or "no pass" result, without any quantification of the amount of layer misregistration involved.

Of course, the inner layers of the fabricated printed circuit board cannot be viewed to visually determine the amount of misregistration, at least not without destroying the board by cutting it apart. Thus, if a particular board passed the test, there was no guarantee that the board would not later fail due to thermal changes or mechanical flexing which might be sufficient to cause a through-hole to lose electrical contact with a desired trace or make electrical contact with an undesired trace. In other words, one could never be sure that a board which passed the registration test did not have marginally adequate layer-to-layer registration and would not later fail during use. As a result, larger-than-necessary allowances in size and position of traces and spaces therebetween were made to lessen the likelihood that a board that passed a registration test would subsequently fail during use because the layer-to-layer registration was barely within tolerance.

The packaging densities of printed circuit boards have increased dramatically, with more and smaller components requiring increased numbers of interconnecting traces. This requires that the traces be reduced in size and the space between the traces be reduced accordingly. To assure accuracy in fabrication, the photo tooling, image transfer, etching, drilling, lamination and other processes involved in the fabrication of printed circuit boards must be controlled within ever tighter tolerance limits. As the board manufacturers approach the inherent accuracy limitations on these processes, it becomes critical to quantitatively measure the amount of misregistration between layers rather than simply conducting a pass/no-pass registration test. While such knowledge is helpful, not knowing the amount by which the layers are out of registration, it is impossible to determine whether through-holes are making adequate electrical contact with traces or whether minimum electrical clearances are being maintained between through-holes and traces on the hidden inner layers of the printed circuit board.

Further, in those applications where failure costs are unacceptably high, as in printed circuit boards used in life support systems and military equipment, over designing into additional layers and higher costs will not necessarily prevent the recurrent misregistration which results from a failure to identify and cure process failures. In this regard, many boards may be produced which will fail the "pass" or "no pass" test leading to further added expense. Such a system requires not only knowledge of the amount of failure but also the direction of misregistration, that is whether a layer is displaced to the right, left, forward or backwards. Further, such a system requires knowledge of the misregistration of each board regardless of the quantity of misregistration of other boards.

It will therefore be appreciated that there has a been a significant need for a system for measuring the amount and direction of misregistration separately for each printed circuit board layer in quantitative terms. The system should allow the measurements to be conducted quickly, economically, and precisely. Such a system would avoid the current industry practice of overcompensating at the design phase to minimize the impact of inner layer misregistration which prevents the fabrication of printed circuit boards with greater densities. Such a system would also aid in preventing continual production of failing boards due to the inability to identify and correct process failures. The result would be more cost effective production of printed circuit boards, as discussed above.

DISCLOSURE OF THE INVENTION

The present invention resides in a system for measuring the amount of misregistration of printed circuit board layers. The system includes a panel having a plurality of layers, where each layer has electrically conductive traces disposed thereon which require interconnection between the plurality of layers. The layers include an exterior layer and at least one inner layer. The layers are positioned in registration with each other to within a predetermined maximum tolerance range.

A plurality of electrically conductive quantifying conductors are formed in the panel for providing a path of electrical conductivity to the inner layer. The quantifying conductors include first and second conductor portions each including a plurality of conductors aligned along common first and second axes, respectively. The plurality of conductors also include at least one common conductor.

A plurality of registration traces are formed upon the inner layer for cooperating with the plurality of quantifying conductors to determine the direction and quantity of misregistration of the inner layer with respect to the exterior layer. Each trace has a common portion adapted to be in electrical contact with the common conductor whether or not the inner layer is in registration with the exterior layer. The traces each have a quantifying trace portion adapted to produce a plurality of incrementally varying clearances between the quantifying conductors and the trace if the inner layer is in perfect registration with the exterior layer. Accordingly, the quantifying conductors will be out of electrical contact with the trace if the inner layer is in perfect registration with the exterior layer, and one or more of the quantifying conductors will be in electrical contact with the trace if the inner layer is out of registration with the exterior layer. If the trace is in electrical contact with the first portion of conductors then this indicates misregistration in a first direction and electrical contact between the trace and the second portion of conductors indicates misregistration in a second direction.

In an alternative embodiment, the common conductor comprises a first, second, third and fourth common conductors and the trace includes respective first, second, third and fourth trace portions. The first and second trace portions are electrically coupled to the first and second common conductors, respectively, and adapted to cooperate with the first portion of conductors to determine the quantity of and direction of misregistration in the first direction. Likewise, the third and fourth trace portions are electrically coupled to the third and fourth common conductors, respectively, and adapted to cooperate with the second portion of conductors to determine the quantity of and direction of misregistration in the second direction.

BEST MODE FOR CARRYING OUT THE INVENTION

Figure 1:
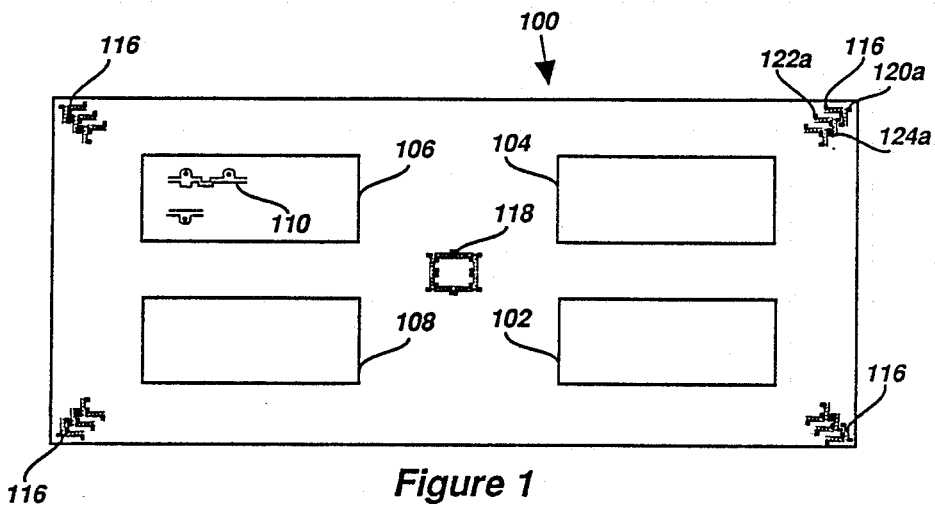
FIG. 1 is an illustration of a panel containing a plurality of printed circuit boards wherein the panel includes structure which is the subject of the present invention.

As shown in the drawings for purposes of illustration, the present invention is embodied in a system for measuring the amount of misregistration of printed circuit board layers. The system is particularly adapted for use with a panel, indicated generally by reference numeral 100, FIG. 1, that includes a plurality of printed circuit boards 102 through 108 contained thereon. The panel 100 is fabricated from a plurality of layers using known techniques to provide the plurality of printed circuit boards. The boards 103 through 108 may be separated from the panel, also using known techniques.

Figure 3:
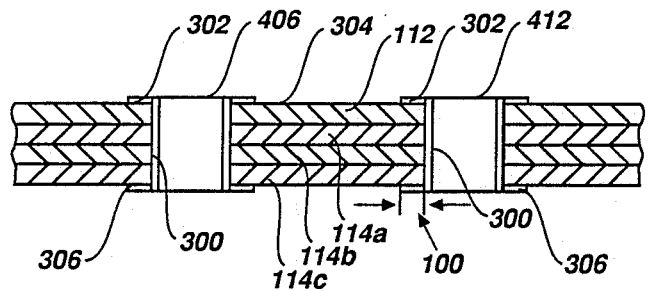
FIG. 3 is a fragmentary view of FIG. 4 taken along the lines 3—3.

As shown in FIG. 1 for the uppermost layer of the circuit board 106, each of the circuit board layers, and hence the panel layers, has electrically conductive traces 110 which require interconnection between the layers. As shown in FIG. 3, the layers of the panel 100 include an uppermost exterior layer 112 and a plurality of inner layers, indicated by the reference numerals 114a, 114b and 114c. While the inner layer 114c is referred to as an "inner layer" relative to the exterior layer 112, it is actually at the lowermost position of the panel 100. While the panel 100 is shown in the drawings as being a four-layer panel, the present invention can be practiced with panels of any number of layers. However, it will be apparent to those skilled in the art that each of the printed circuit boards 102 through 108 of the panel 100 must have the same number of layers.

The layers 112 and 114a–c are positioned in registration with each other within a predetermined maximum tolerance range. If the layers are grossly out of registration, the present invention will not function. However, misregistration by such a large amount would be evident from visual inspection. The more difficult problem, and the one solved by the present invention, involves the situation in which the hidden inner layers are out of registration with the exterior layer, and hence each other, by a few thousandths of an inch, which is not enough to be visually detectable, but yet is beyond an acceptable tolerance limit. With the present invention, it is possible to determine not only whether or not the inner layers are in registration within a desired tolerance limit, but also the quantitative amount of layer misregistration that exists and the direction of misregistration. It is possible to determine the accuracy of the misregistration within one thousandths of an inch, or less if desired.

The present invention uses an electrically conductive, thin metallic sheet or film, commonly referred to as a registration check plane, attached to each of the inner layers 114a–c, the registration check planes of each layer cooperating with a conductor formation 116 to provide a registration check system. The conductor formation 116 comprises a plurality of sets of trace conductors 120, 122, and 124, each in electrical contact with the check plane of a layer of the panel 100. The registration check planes may be deposited and shaped on the layers using conventional printed circuit board fabrication techniques as part of the process used to form the traces 110. As such, the planes can be added during the design phase to insure proper placement on the inner layers relative to the traces, and formed using a conventional film and etching process. The traces are formed with almost no extra cost or effort involved.

It is desirable to locate the planes on the inner layers 114a–c about the periphery of the panel 100 as is illustrated by the trace conductors 120, 122 and 124. As is shown in FIG. 1, a conductor formation 116 may be placed in each corner of the panel 100. Further, conductor formations may be placed on the panel 100, such as on the interior thereof, as is the conductor formation 118. In the presently preferred embodiment of the invention, however, it is desirable to keep the planes from contacting and becoming a portion of the layers of the boards 102 through 108.

Each set of trace conductors 120, 122 and 124 have a generally "V" shape, and the plurality of trace conductors 120, 122 and 124 are positioned in diagonal alignment in the corner of the panel 100. It is desirable to position conductor formations, and hence the underlying planes, at opposite corners of the panel to achieve a measure of misregistration for the panel representative of all portions thereof. To determine the misregistration direction and quantify the misregistration amount, it may be desirable to place the conductor formations 116 in each corner of the panel 100 as shown in FIG. 1. As will become apparent throughout the discussion below, it is not necessary that the trace conductors be diagonally aligned, but this formation is desirable to allow compact spacing of the trace conductors and underlying check planes. However, it is desirable that the trace conductors and the underlying check planes have a "V" shape to allow quantification of misregistration in orthogonal directions, as will also become apparent below.

Each set of trace conductors 120, 122 and 124 of the conductor formation 116 corresponds to one of the check planes located on one of the interior layers of the panel 100. In the embodiment being illustrated herein, three interior layers 114a–c require three check planes for determining the registration of each layer. The traces for the check planes would each be fabricated on one of the interior layers to determine that layer's misregistration as will be described in more detail below. Accordingly, a trace 120a would be fabricated upon the layer 114a to produce its check plane, a trace 122a fabricated upon the layer 114b and a trace 124a fabricated upon the layer 114c.

Figure 2:
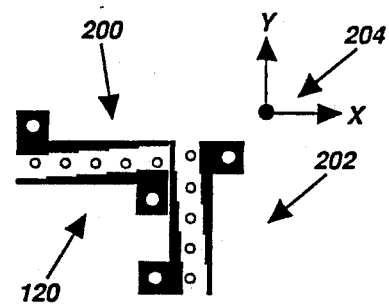
FIG. 2 is an enlarged top plan view of the trace that is attached to each of the inner layers of the panel of FIG. 1 prior to assembly of the layers.
Figure 4:
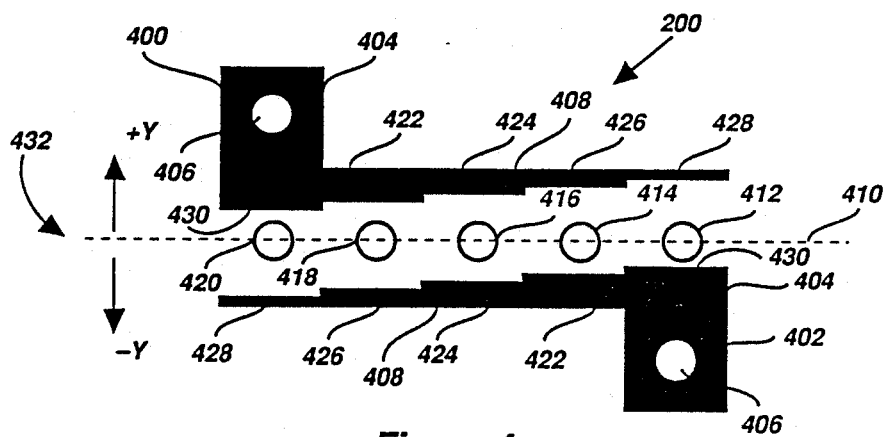
FIG. 4 is an enlarged view of a trace portion illustrating the manner of quantification of misregistration of the layers in accordance with the subject invention.

The trace 120a is shown in FIG. 2 removed from the inner layer 114a to which it is attached to practice the invention. The traces 122a and 124a associated with the layers 114b and 114c, respectively, are constructed and function in a manner similar to the trace 120a. Accordingly, only the trace 120a will be described in detail herein. The trace 120a comprises two substantially identical trace portions 200 and 202 positioned in orthogonal relation to provide the general "V" shape of the trace 120a. The trace portion 200 is illustrated in more detail in FIG. 4. It will be apparent, however, to those skilled in the art that the trace portion 202 is substantially identical to the trace portion 200. Accordingly, only trace portion 200 will be described in detail herein.

The trace portion 200 includes two substantially identical trace conductor members 400 and 402 positioned in opposing relation. Each conductor member includes a ground, or common, portion 404 which is made of substantial size to insure contact with a through-hole 406 formed in the center thereof. Although the traces 120a, 122a and 124a are formed during fabrication of each layer as part of the overall deposit and etch process, the through-hole 406 is formed afer the panel 100 is complete. A conductor is formed in the through-hole, as will be described in more detail below. The common portion 406 is therefore sized to be in electrical contact with the conductor of the through-hole 406 taking into consideration the maximum misregistration possible.

The conductor members 400 further include elongate conductor portions 408 each having a thickness which decreases incrementally. The conductor members 400 and 402 are each positioned in relation to a common axis 410 such that the elongate conductor portions thereof have incrementally varying clearances from the axis 410. A plurality of through-holes 412 through 420 are each drilled along the axis 410 after completion of the panel 100 in a manner similar to the through-hole 406. Accordingly, since the elongate conductor portion 408 of the conductor members 400 and 402 have incrementally varying clearances from the common axis 410, they also have incrementally varying clearances from the through-holes 412 through 420.

In the presently preferred embodiment of the invention the incremental variation in the clearance from the axis 410 is provided by fabricating the elongate portion 408 of a plurality of elongate conductor segments 422 through 420 each of varying thickness so that the thickness of the elongate conductor portion 408 decreases incrementally. The conductor segments cooperate with the through-holes to quantify the misregistration of the layer 114a of the panel 100. That is, since the through-holes 412 through 420 are formed in the panel after the trace 120, contact of any through-hole 412 through 420 with the conductor member 400 will indicate misregistration of the layer 114a of the panel. Since the amount of clearance, which should be present in absence of any misregistration, between any through-hole 412 through 420 and its respective elongate conductor segment 422 through 430 the conductor member 400 is known, then the quantity of misregistration can be determined by determining which through-hole is in contact with the conductor member 400.

As an example, assume the clearance between the conductor segment 430 of the conductor member 400 and the through-hole 420 is two thousandths of an inch when there is no misregistration, and the amount of clearance increments two thousandths of an inch for each elongate conductor segment 422 through 428 so that the amount of clearance between the elongate conductor segment 428 and the through-hole 412 is ten thousandths of an inch. If, after conductors are formed in the through-holes the through-hole 418 is in electrical contact with the conductor member 400 but the through-hole 416 is not, then the amount of misregistration is between four and six thousandths of an inch. That is, the board is out of registration at least four thousandths of an inch but less than six thousandths of an inch in a direction orthogonal to the axis 410.

Further, the two conductor members 400 and 402 cooperate to determine the direction of misregistration. That is, in the example given above, if the conductor of the through-hole 418 is in contact with the conductor member 400 then the layer 114a is out of registration at least four thousandths of an inch in the positive "Y"

direction with respect to the coordinates 432. Conversely, if the through-hole 414 is in contact with the conductor member 402 then the layer 114a is out of registration at least four thousandths of an inch in the minus "Y" direction with respect to the coordinate system 432. In similar manner, the trace portion 202 determines the direction of misregistration of the layer 114a in the "X" direction with respect to the coordinates 204. The trace portion 202 also quantifies the amount of misregistration in each the positive and minus "X" directions.

As used herein, the length of the elongate conductor segments 422 through 430 refers to the dimension perpendicular to the measuring direction of the subject trace portion. That is, the trace portion 200 measures misregistration in the "Y" direction so that the length of the elongate conductor segments 422 through 430 and the common portion 404 to the trace portion 200 is measured in the "X" direction. It will be apparent to those skilled in the art that the length of the elongate conductor segments must be large with respect to the maximum expected misregistration. This will assure that contact of any of the through-holes 412 through 420 with the conductor members 400 or 402 of trace 200 indicates precise misregistration in the presence of displacement of the layer 114a in the "X" direction, i.e., "X" direction misregistration. In other words, this will assure that the through-hole 416 will never contact the elongate conductor segments 418 or 414.

Further, it will be apparent to those skilled in the art that although the incremental variation in clearance is provided by providing a stepped conductor member 400 in the present invention, other variations may be provided, such as an angled conductor to create a continuously varying clearance. Alternately, the invention may be practiced by incrementally varying the diameter of the through-holes 412 through 420 and placing them between two traces with parallel straight edges. However, the stepped conductor of the present invention is easier to fabricate since the through-holes are drilled on a straight placement line and have constant diameter, and, therefore, preferred to an angled conductor or varied hole-diameter arrangement. Still further, while the trace portions 200 and 202 are illustrated herein as comprising a pair of conductor members in opposing relation with a plurality of through-holes positioned therebetween, those skilled in the art will appreciate that the invention will be equally workable with a pair of aligned through-holes in opposing relation with a single conductor therebetween and wherein each side of the conductor is shaped to incrementally vary the clearances from its respective set of aligned through-holes. Many other variations for the through-holes and conductors will become apparent to those skilled in the art.

The minimum amount of clearances which can be measured in the presently preferred embodiment of the invention is two thousandths of an inch with increments of two thousandths of an inch. However, it will be appreciated that minimums of any amount may be chosen with increments of any amount. Accordingly, a minimum of one thousandths of an inch with one half thousandths increments may be selected. The only limitation on the minuteness of minimum or incremental measurement is the limitation on ability to fabricate the conductor portions. Further, the clearance, or increment thereof, need not be uniform along the length of the conductor members nor need it be identical for each trace segment. Variation of the increment between trace segments will allow variable measurement of the misregistration in the "X" and "Y" directions.

It will also be apparent to those skilled in the art that the placement of the traces 120a, 122a and 124a must be controlled and that the positioning of the through-holes for the trace conductors 120 through 124 must be formed with accuracy. This is necessary to insure the integrity of the measurement. Like the trace 120a, the traces 122a and 124a indicate and quantify the misregistration of the layers 114b and 114c, respectively, independent of the registration, or lack thereof, of any other layer.

With the exterior layer 112 and the inner layers 114a-c laminated together, the through-holes 412 through 420 and 406 are formed for each of the traces 120a, 122a and 124a for each of the check planes of each layer 114a-c. Each through-hole 412 through 420 and 406 for each trace portion of each trace 120a, 122a and 124a for each layer 114a-c is formed in a similar manner as will be described by reference to through-holes 406 and 412 shown in FIG. 3. Each through-hole 406 and 412 is provided with a conductor 300 which is formed on the sidewall of the through-hole using known plating techniques. Each conductor 300 includes an electrically conductive contact pad 302 attached to an exposed exterior surface 304 of the exterior layer 112. The contact pads are circular and are arranged in a contact pad placement pattern corresponding to the placement pattern for the through-holes 412 through 420 and 406 for each trace portion 200 and 202. The contact pads for each trace portion 200 and 202 being placed in the orientation to create the trace conductors 120 through 124. Further, the contact pads of each trace 120a, 122a and 124a of each plane 116 will be oriented to form the pattern as illustrated in FIG. 1.

As noted above, the conductors 300 are formed by drilling a hole through the layers 112 and 114a-c and then plating the hole to form a conductor with the shape of a barrel. The holes are drilled through the contact pads 304, which are typically placed prior to drilling, and when the drilled hole is plated to form the conductors 300 the plating adheres to the corresponding contact pads 302. The contact pads serve to prevent the conductors 300 from falling out of the drilled holes, and also as electrical contact points on the exterior surfaces of the board. It will be apparent that pads 306 may be provided on the reverse side of the panel 100, but only pads 302 are necessary to practice the present invention.

With the arrangement described above, when any one of the inner layers 114a-c is out of registration with the exterior layer 112 by a sufficiently large amount, one or more electrically conductive paths are established between the contact pads 300 of the through holes 412 through 420 and the contact pad 300 of the through-hole 406 for that layer. Electrical continuity may be determined by use of a continuity tester 500, such as will be described below. Each of the electrically conductive paths established is through a conductor 300 of one of the through-holes 412 through 420 thereby indicating that the through-hole is in contact with the conductor member 400 or 402 and further indicating the quantity and direction of misregistration.

Figure 5:
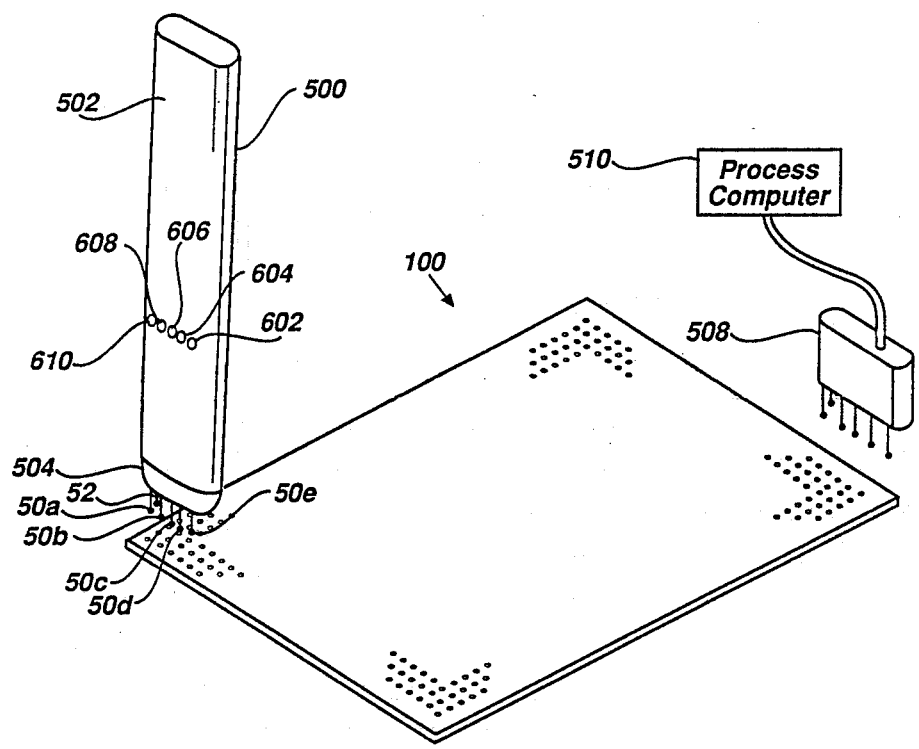
FIG. 5 is a perspective view of the panel of FIG. 1 illustrating alternative methods for sensing conduction to thereby determine misregistration.

The tester 500, shown in FIG. 5, is a handheld device with a case 502 and a head 504 such as that shown and described in the afore-references U.S. Application Ser. No. 216,080 entitled SYSTEM FOR MEASURING MISREGISTRATION OF PRINTED CIRCUIT BOARD LAYERS filed July 7, 1988 by Tom R. Paur, the disclosure of which is incorporated herein, in its entirety, by the foregoing reference thereto. Mounted within the case is a battery 600, shown schematically in FIG. 6. The case 502 also supports five light-emitting diodes 602, 604, 606, 608 and 610 which produce visible light when activated.

The head 504 of the tester 500 has mounted thereon five axially spring-loaded probes 50a, 50b, 50c, 50d and 50e, and an axially spring-loaded common probe 52. The probes 50a-e and the common probe 52 having a placement pattern corresponding to the placement pattern for the contact pads 300 of the through-holes 412 through 420 and 406 of conductor member 400 of the trace portion 200, which is the same pattern for the conductor member 402, and for the conductor members of the other trace portion 202. With such a placement pattern for the probes on the head 504, the tester may be conveniently grasped by the user and held with the probes in electrical contact with the contact pads and common pad to accomplish the continuity check referred to above. The user first checking for continuity between any of the through-holes 412 through 420 and the through-hole 406 of the conductor member 400 to determine the quantity of misregistration of the layer 114a in the positive "Y" direction and then checking the continuity between any of the through-holes 412 through 420 and the contact pad of the through-hole 406 of the conductor member 402 to determine the quantity of misregistration in the negative "Y" direction. This process would be repeated for the trace portion 202 to determine the quantity of positive and negative "X" direction misregistration of the layer 114a and the entire process repeated for layers 114b and c.

Figure 6:
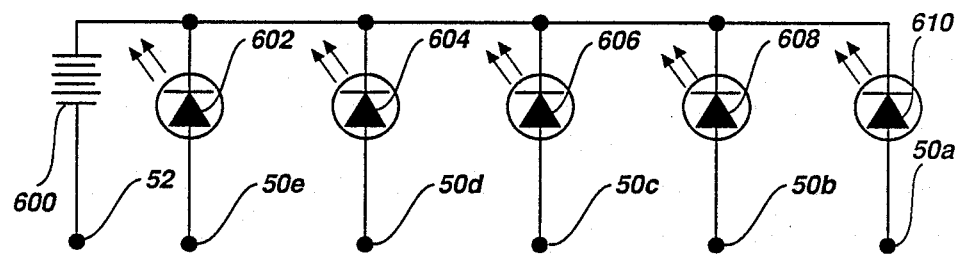
FIG. 6 is a schematic diagram of the circuitry for the testers shown in FIG. 5.

As shown in FIG. 6, the anode of each of the light-emitting diodes 602–610 is connected to a corresponding one of the probes 50a-e, and the cathodes of the light-emitting diodes are connected together and to the positive terminal of the battery 600. The negative terminal of the battery is connected to the common probe 52. As such, if one or more of the conductors 300 of the through-holes 412 through 420 are in contact with the conductor 300 of a through-hole 406 as a result of misregistration of an inner layer, a complete circuit is accomplished and current flows through the corresponding light-emitting diodes.

In the example given above, the light-emitting diodes 610 and 608 would be illuminated to indicate electrical contact between the contact pads 300 of the through-holes 420 and 418 while no other led would be illuminated.

The illumination of any light-emitting diodes 602–610 indicates that the subject layer, layer 114a in our examples, is out of registration with the exterior layer 112 by at least the minimum clearance amount. Of course, if the misregistration in the positive "Y" direction were of sufficient enough size that the conductor of through-hole 412 were in electrical contact with the elongated conductor portion 428, the light-emitting diode 602 would also be illuminated and the user would know that layer 114a was out of registration by more than the clearance of the elongate portion 428 from the through hole 412.

With the present invention, the quantitative amount of misregistration can be measured very precisely, easily, and economically. Furthermore, not only can one determine if the printed circuit board is within a desired tolerance limit, it can be determined how close each of the inner layers of the board are to the tolerance limit and in which direction the layer is out of registration. In such manner, printed circuit boards that might test as satisfactory using a conventional pass/no-pass continuity test, but yet be out of registration by a sufficient amount that the board might fail during use, can be identified with the present invention. Further, since the present invention provides a means of very precisely determining the amount and direction of misregistration, the designers not need build extremely large safety margins into their designs, as was the case when the precise amount of misregistration could not be measured.

By placement of conductor formations 116 in each corner of the panel 100, in addition to the underlying traces of each layer, we can check the registration of each corner of each layer to determine the quantity and direction of any misregistration with respect to that corner. Accordingly, even if a layer is rotated about a particular corner, such that the misregistration of that corner may be within the established tolerance, the "rotational misregistration" will be detected when checking the misregistration of that layer with respect to another corner. Rotational misregistration is as common as linear misregistration but, could not be detected using conventional means. With the present invention, such rotational misregistration can be detected.

It is to be understood that while a hand-held tester using light-emitting diodes to provide a visual indication of the amount of misregistration has been described, the tester need not be hand-held and may be incorporated into a computer-based, automatic test system in which the continuity check is accomplished automatically. In such a system, the results may be displayed or recorded in other manners or used in the process to automatically determine whether a printed circuit board is sufficiently in registration to be used. In this embodiment, as with a hand-held tester configuration, the light-emitting diodes can be replaced with a digital numerical display and associated circuitry.

However, the automatic computer based tester configuration lends particularly to identification of process errors and correction thereof before panels are produced that are not within tolerance. An illustrative system is shown in FIG. 5. Therein an automated sensor element 508, which may be similar to the hand held tester 500, is adapted to be automatically placed in contact with the panel 100. The motion control of the sensor 508 may be controlled by a variety of linear motion controllers or robots as is known in the art. While only one sensor 508 is shown in FIG. 5, those skilled in the art will appreciate that a sensor 508 may be provided for each trace portion of the panel 100 thereby further enhancing automatic testing.

The sensor 508 is coupled to a process computer 510 to provide results of the continuity test thereto. The process computer may comprised a conventional control devices such as, microprocessor or other computing apparatus, interfaces for the sensors and other control devices, memory, user interfaces (keyboards, screens, etc.), and other control circuitry. Further, to enhance automation, the process computer may comprise apparatus for controlling the motion of the sensors 508. Still further, apparatus may be provided for automatically moving the panel to be tested into position prior to lowering the sensors 508. The process computer 510 may also be adapted to control this motion.

During automated testing of misregistration, the process computer would not only be able to immediately determine any X-Y misregistration of each layer of the panel by amount and direction, but would also be able to record and plot the results for each layer of each panel produced during a particular period of time. The results may be monitored, or otherwise periodically checked, for patterns of misregistration or increasing misregistration in a particular direction. Alternatively, the process computer may be provided with maximum limits on miregistration (which would be less than any failing tolerances) and programmed to provide some indication such as a light or bell upon misregistration beyond the limit at which time the process may be corrected and production continued. Such a system will allow process control to discover and correct process errors thereby to prevent fabrication of failing printed circuit boards.

It will be appreciated that, although specific embodiments of the invention have been described herein for purposes of illustration, various modifications may be made without departing from the spirit and scope of the invention. Accordingly, the invention is not be limited except as by the appended claims.

I claim:

1. A system for measuring the amount of misregistration of a panel comprising:

a plurality of layers each having electrically conductive traces which require interconnection between said layers, said layers including an exterior layer and a plurality of inner layers inwardly located relative to said exterior layer, said layers being positioned in registration with each other within a predetermined maximum tolerance range;

a plurality of electrically conductive quantifying conductor means for providing a path of electrical conductivity to said inner layer, said quantifying conductor means comprising at least first and second conductor portions each said first and second conductor portions including a plurality of conductors aligned along common first and second axes respectively, said first portion of conductors being aligned in an arrangement substantially identical to said second portion of conductors, wherein said first axis is angled to said second axis, said quantifying conductor means further including at least one common conductor;

registration trace means formed upon said inner layer for cooperating with said quantifying conductor means to determine the direction and quantity of misregistration of said inner layer with said exterior layer, said trace means having a common portion adapted to be in electrical contact with said at least one common conductor whether or not said inner layer is in registration with said exterior layer, said trace means having a quantifying trace portion adapted to produce a plurality of incrementally varying clearances between said quantifying conductor means and said trace means if said inner layer is in perfect registration with said exterior layer, said quantifying conductors being out of electrical contact with said trace means if said inner layer is in perfect registration with said exterior layer, and one or more of said quantifying conductors being in electrical contact with said trace means if said inner layer is out of registration with said exterior layer wherein electrical contact of said trace means with said first portion of conductors indicates misregistration in a first direction and electrical contact between said trace means and said second portion of conductors indicates misregistration in a second direction; and tester means for determining the electrical contact between said plurality of conductors and said at least one common conductor, said tester means including a plurality of probes for contacting said conductors and said at least one common conductor for determining if a conductive path exists between any one of said conductors of said first and second conductor portions and said at least one common conductor.

2. The system of claim 1 wherein said at least one common conductor comprises first and second common conductors and wherein said trace means further comprises first and second trace portions adapted to cooperate with said first and second plurality of conductors, respectively, to determine the direction and quantity of misregistration of said inner layer in the first and second directions.

3. The system of claim 1 wherein said at least one common conductor comprises first, second, third and fourth common conductors and wherein said trace means further comprises first, second, third and fourth trace portions, said first and second trace portions being electrically coupled to said first and second common conductors, respectively, and adapted to cooperate with said first portion of conductors to determine the quantity of misregistration in the first direction and said third and fourth trace portions being electrically coupled to said third and fourth common conductors, respectively, and adapted to cooperate with said second portion of conductors to determine the quantity of misregistration in the second direction.

4. The system of claim 3 wherein said first and second trace portions are positioned in opposing relation with said first portion of conductors being formed therebetween.

5. The system of claim 4 wherein said third and fourth trace portions are positioned in opposing relation with said second portion of conductors being formed therebetween.

6. The system of claim 2 wherein each said first, second, third and fourth trace portion comprises a plurality of elongate trace conductor segments having varying thicknesses such that the variation in the thickness of each said conductor segment provides the incremental variation in clearance between said quantifying conductor and said first trace means, each said trace conductor segment being electrically coupled its respective common conductor.

7. The system of claim 6 wherein the length of each said conductor segment is selected to be larger than the maximum expected misregistration to ensure the integrity of the incrementally increasing clearances.

8. The system of claim 1 further comprising a second inner layer, second quantifying conductor means for providing a path of electrical conductivity to said second inner layer, and second trace means for cooperating with said second quantifying conductor means to determine the quantity and direction of misregistration of said second inner layer in the first and second directions.

9. The system of claim 1 wherein said first and second plurality of quantifying conductors are positioned in orthogonal relation to determine the misregistration in directions which are orthogonal to one another.

10. The system of claim 1 wherein said first and second plurality of quantifying conductors are formed along substantially parallel axes to determine the misregistration in directions which are opposite to one another.

11. The system of claim 1 wherein said trace means is positioned along a perimeter portion of said inner layer, outward from said traces thereon and out of electrical contact with said traces thereon.

* * * * *

UNITED STATES PATENT AND TRADEMARK OFFICE
CERTIFICATE OF CORRECTION

PATENT NO. : 4,918,380

DATED : April 17, 1990

INVENTOR(S) : Tom R. Paur

It is certified that error appears in the above-identified patent and that said Letters Patent is hereby corrected as shown below:

Column 12, line 44;
In claim 6, "claim 2" should read "claim 3".

Signed and Sealed this

Eleventh Day of February, 1992

Attest:

HARRY F. MANBECK, JR.

*Attesting Officer*     *Commissioner of Patents and Trademarks*